United States Patent [19]

Gomi

[11] Patent Number: 4,476,443
[45] Date of Patent: Oct. 9, 1984

[54] TRANSISTOR CIRCUIT

[75] Inventor: Hiroshi Gomi, Kumagaya, Japan

[73] Assignee: Tokyo Shibaura Denki Kabushiki Kaisha, Kawasaki, Japan

[21] Appl. No.: 355,141

[22] Filed: Mar. 5, 1982

[30] Foreign Application Priority Data

Mar. 31, 1981 [JP] Japan .................... 56-46175

[51] Int. Cl.³ ............................................. H03F 3/04
[52] U.S. Cl. .................................................... 330/288
[58] Field of Search ................. 330/288; 323/315, 316

[56] References Cited

U.S. PATENT DOCUMENTS 3,952,257 4/1976 Schade, Jr. ........................... 330/288
4,380,740 4/1983 Kaplan ................................. 330/288

FOREIGN PATENT DOCUMENTS 1265157 3/1972 United Kingdom .
1364047 8/1974 United Kingdom .
1373133 11/1974 United Kingdom .
2050100 5/1979 United Kingdom .
2058504 9/1979 United Kingdom .

Primary Examiner—James B. Mullins
Assistant Examiner—Gene Wan
Attorney, Agent, or Firm—Cushman, Darby & Cushman

[57] ABSTRACT

A transistor circuit is formed of at least two unit transistors. Each unit transistor includes an NPN bipolar transistor and a PN junction diode. The P region (anode) of the PN junction diode is connected to the P region (base) of the NPN transistor. The N region (cathode) of the PN junction diode is connected directly or indirectly to the N region (emitter) of the NPN transistor. One of the unit transistors is so connected to the other unit transistor as to form a Darlington circuit.

13 Claims, 9 Drawing Figures

F I G. 5
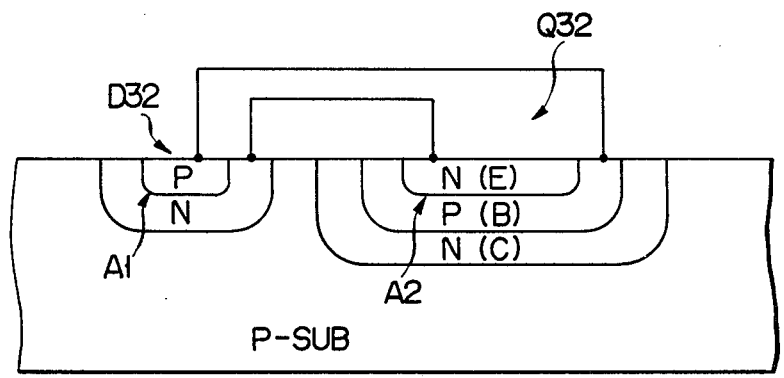
F I G. 6
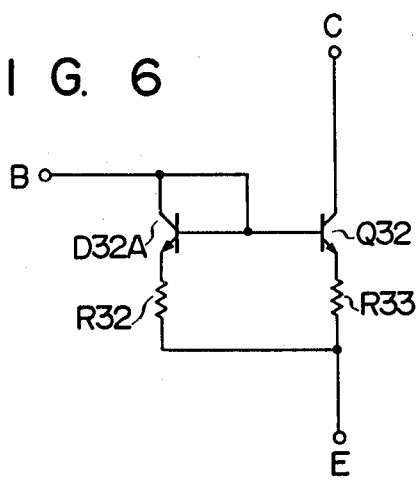
F I G. 7
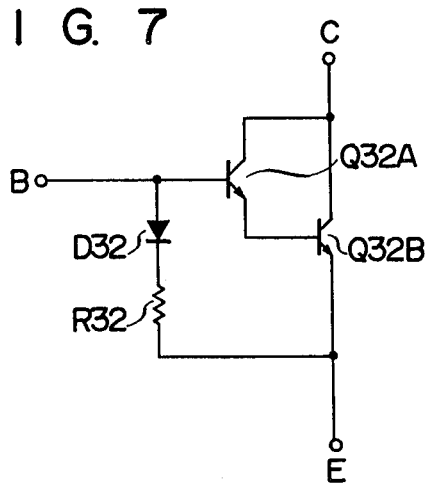

TRANSISTOR CIRCUIT

BACKGROUND OF THE INVENTION

This invention relates to a transistor circuit, particularly to a transistor amplifier circuit in which changes of its input impedance due to a variation of the current amplification factor of a transistor are effectively prevented.

In general, changes of input impedance of a transistor amplifier circuit affect the whole circuit operation. For instance, in a charge/discharge circuit of a sample/hold circuit or in an amplifier circuit for amplifying a signal detected by an AM detector, output level variations due to input impedance changes cause an erroneous or inaccurate operation of the circuit. It is therefore essential to design the circuit so as to reduce the input impedance changes.

Such a problem as mentioned above will be described with reference to FIG. 1. In this figure, an amplitude-modulated signal applied to a terminal P1 is envelope-detected by the circuit comprising a base-emitter diode of transistor Q1 and a capacitor C1. The envelope-detected signal is current-amplified by transistors Q2 and Q3 and then outputted from a terminal P2 which is connected to an emitter resistor R1 of the transistor Q3. When the current amplification factors $\beta_1$ and $\beta_2$ of the transistors Q2 and Q3 are varied, the output signal level is also varied. This is because the product of the capacitance of capacitor C1, the resistance of resistor R1 and the variations of current amplification factors $\beta_1$, $\beta_2$ of transistors Q2, Q3 considerably varies the discharge time constant for the charged capacitor C1. Thus, the variation of current amplification factors of transistors Q2 and Q3 affects the operation of the whole circuitry. In other words, the input impedance of transistor Q2 as well as the discharge time constant are influenced by the product of the current amplification factor variations of transistors Q1, Q2, that is, $\Delta\beta_1$, $\Delta\beta_2$.

To make the circuit operate more accurately, input impedance changes of the transistor circuit should be avoided as much as possible.

SUMMARY OF THE INVENTION

It is accordingly an object of the present invention to provide a transistor circuit which is free from the influence of input impedance changes.

To achieve the above object, a transistor circuit of the invention has an improved combination of a current mirror circuit and a Darlington circuit. The current mirror circuit includes a bipolar transistor whose base and emitter are coupled via a PN junction diode. The circuit formed by the transistor and diode constitutes a unit transistor. At least two unit transistors are connected, thus forming a Darlington type (i.e. a Darlington or inverted Darlington) circuit. Due to the operation of the current mirror circuit, the input impedance of the unit transistor is affected very little by a variation of the current amplification factor of the bipolar transistor. The current mirror circuit operation inherently reduces the effective current amplification factor of the unit transistor. But such reduction of the current amplification factor is compensated for by the current boost operation of the Darlington circuit. Accordingly, a high current amplification factor with little variation can be obtained. That is, a transistor circuit which has a sufficiently high and practically constant input impedance can be obtained.

BRIEF DESCRIPTION OF THE DRAWINGS

FIG. 5 shows the PN junction areas of the transistor Q32 and the diode D32 formed in a semi-conductor P-substrate, which indicates that the ratio n of those areas (base-emitter of Q32/junction of D32) is larger than "1";

FIG. 6 shows another embodiment of the unit transistors of the present invention;

FIG. 7 shows another embodiment of the unit transistors of the present invention;

DETAILED DESCRIPTION OF THE PREFERRED EMBODIMENTS

An embodiment of the present invention will be described with reference to FIGS. 2 to 9, wherein the same or similar reference symbols are used to designate the same or similar portions for brevity's sake.

Figure 1:
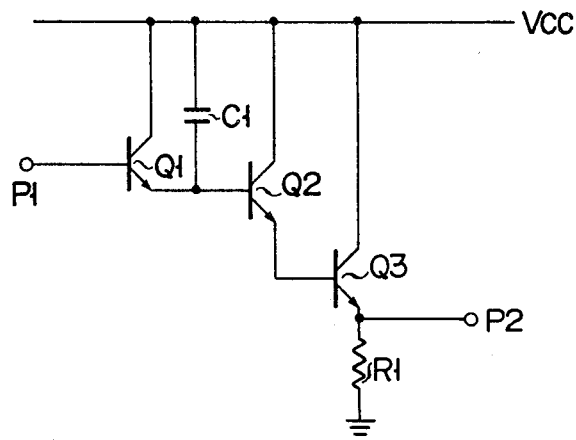
FIG. 1 shows a conventional transistor circuit whose particular problem is solved by the present invention.
Figure 2:
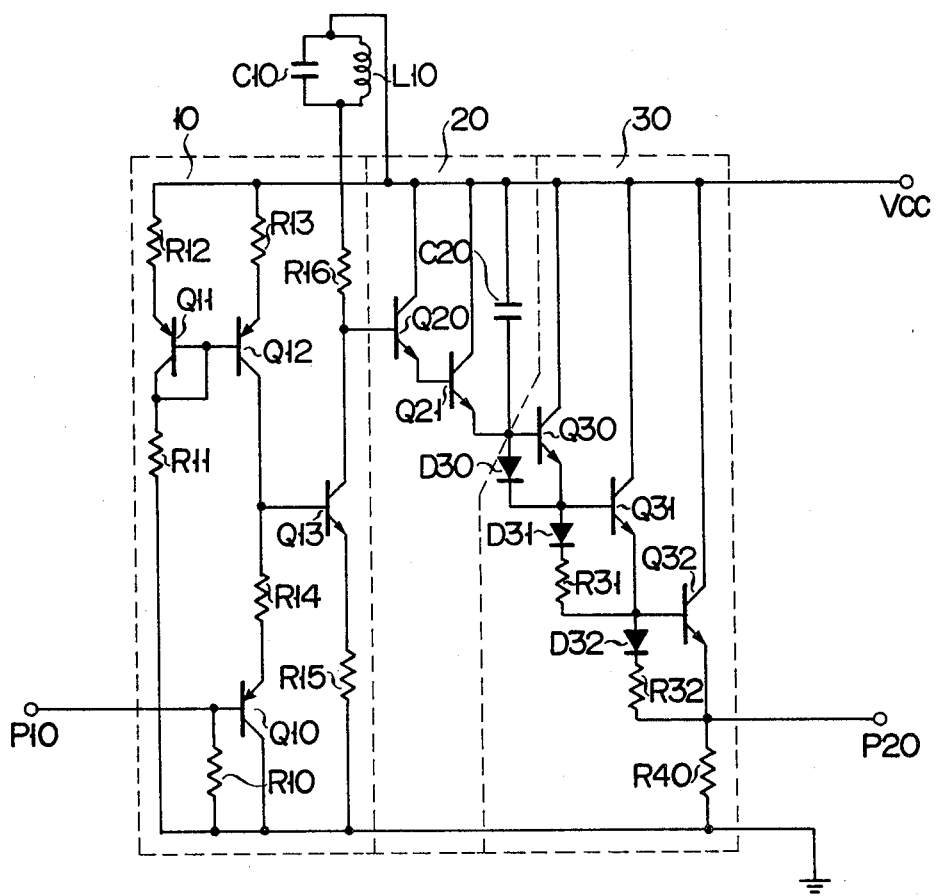
FIG. 2 shows an embodiment of the present invention wherein the invention is applied to an AM demodulator.

Referring now to FIG. 2, there is shown an AM demodulator for demodulating an amplitude-modulated signal to which a transistor circuit of the present invention is applied.

In FIG. 2, an amplitude-modulated signal is applied to an input terminal P10 and amplified by a preamplifier circuit 10 which comprises transistors Q10–Q13, resistors R10–R16 and an LC resonance circuit including the capacitor C10 and an inductor L10. The terminal P10 is connected to the base of PNP transistor Q10 and grounded via resistor R10. The collector of transistor Q10 is grounded. The emitter of transistor Q10 is coupled via resistor R14 to the collector of PNP transistor Q12. The emitter of transistor Q12 is coupled via resistor R13 to power supply VCC. The base of the transistor Q12 is connected to the base and collector of PNP transistor Q11. The emitter of transistor Q11 is coupled via resistor R12 to power supply VCC. The base of transistor Q11 is grounded via resistor R11. The collector of transistor Q12 is connected to the base of NPN transistor Q13. The emitter of transistor Q13 is grounded via resistor R15. The collector of transistor Q13 is coupled via the resistor R16 and the LC resonance circuit to a power supply VCC.

The transistor Q10 forms an emitter follower, and the LC resonance circuit provides a means for extracting a given carrier signal with a specific frequency. The modulated signal amplified by preamplifier 10 is supplied to a detector circuit 20 having transistors Q20, Q21 and capacitor C20, and is amplitude-detected. The collector of transistor Q13 is connected to the base of NPN transistor Q20. The collector of transistor Q20 is connected to power supply VCC, and the emitter thereof is connected to the base of NPN transistor Q21. The collector of transistor Q21 is connected to power supply VCC and the emitter thereof is coupled via capacitor C20 to power supply VCC. The detected signal derived from the emitter of transistor Q21 is also amplified by a transistor circuit 30 which includes the three-stage cascade-connected transistors Q30–Q32, resistors R31, R32, R40 and diodes D30–D32. The emitter of transistor Q21 is connected to the base of NPN transistor Q30. The base of transistor Q30 is coupled via the anode-cathode path of PN junction diode D30 to the emitter thereof. The emitter of transistor Q30 is connected to the base of NPN transistor Q31. The base and emitter of transistor Q31 are coupled via the anode-cathode path of PN junction diode D31 and resistor R31. The emitter of transistor Q31 is connected to the base of NPN transistor Q32. The base and emitter of transistor Q32 are coupled via the anode-cathode path of PN junction diode D32 and resistor R32. The emitter of transistor Q32 is connected to an output terminal P20 and grounded via resistor R40. The collectors of respective transistors Q30–Q32 are connected to the power supply VCC. These transistors Q30–Q32 provide a discharge current path for capacitor C20.

In FIG. 2, the discharge time constant T is given as:

$$T = Zin \cdot C20 \quad (1)$$

where Zin is the input impedance measured from the base circuit of transistor Q30 and C20 is the capacitance of capacitor C20. The impedance Zin depends on the product of the current amplification factors $\beta 30$–$\beta 32$ of transistors Q30–Q32 and the resistance of resistor R40, i.e. Zin $\alpha$ $\beta 30 \cdot \beta 31 \cdot \beta 32 \cdot R40$. Accordingly, to suppress changes of the input impedance Zin, each current amplification factor of transistors Q30–Q32 should be constant.

In this invention the current amplification factor variation of each transistor is effectively lessened by a specific circuit, i.e., a so-called "current mirror circuit". An equivalent or effective current amplification factor of the current mirror transistor is, however, decreased by the current mirror operation. This drawback is overcome by combining a Darlington connection with plural current mirror transistors. This is the key point of the present invention. The effective current amplification factor of a current mirror transistor may optionally be determined by the ratio of the emitter area of a transistor to the junction area of a diode, the transistor and diode comprising the current mirror circuit.

Now, minimization of the current amplification factor variation of the current mirror transistor will be explained in detail.

Figure 3:
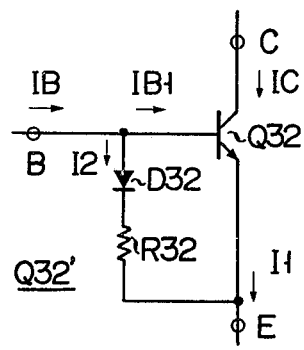
FIG. 3 shows a basic circuit configuration of a unit transistor.

FIG. 3 shows the current mirror circuit of transistor Q32 which hereinafter shall be referred to as a unit transistor Q32'. In FIG. 3, I1 denotes the emitter current of transistor Q32, I2 denotes the current flowing through diode D32 and resistor R32, IB1 denotes the base current of transistor Q32 and IC denotes the collector current of transistor Q32.

In FIG. 3, the effective current amplification factor $\beta 32'$ is defined by the ratio of the base current IB of unit transistor Q32' and the collector current IC thereof. That is, assuming $\beta 32 >> 1$:

$$\beta 32' = \frac{IC}{IB} = \frac{I1 \frac{\beta 32}{1 + \beta 32}}{I2 + IB1} \simeq \frac{I1}{I2 + IB1} \quad (2)$$

The currents I1 and I2 can be given:

$$I1 = nA \exp\{(q/kT)VF1\} \quad (3)$$

$$I2 = A \exp\{(q/kT)VF2\} \quad (4)$$

$$I1 = (1 + \beta 32)IB1 \quad (5)$$

where k is Boltzmann's constant, T is the absolute temperature, VF1 is the base-emitter voltage of transistor Q32, VF2 is the PN junction voltage of diode D32, A is the area of PN junction of diode D32, nA is the PN junction area of the emitter of transistor Q32, and n is the ratio of "area of Q32 emitter junction/area of D32 junction".

From equations (2) to (5), $\beta 32'$ is:

$$\beta 32' = \frac{n}{\exp\{(q/kT)(VF2 - VF1)\} + \frac{n}{1 + \beta 32}} \quad (6)$$

Further, $$VF1 = VF2 + R32 \cdot I2 \quad (7)$$

From equations (6) and (7), $\beta 32'$ is given:

$$\beta 32' = \frac{1}{\frac{1}{1 + \beta 32} + \frac{\exp\{-(q/kT)R32 \cdot I2\}}{n}} \quad (8)$$

Equation (8) represents the effective current amplification factor $\beta 32'$ of the unit transistor Q32' and indicates that the value of $\beta 32'$ depends chiefly on the second term of the denominator of equation (8), because $\beta 32$ of bipolar transistor Q32 is much larger than "1". Accordingly, even though the value of $\beta 32$ is varied, $\beta 32'$—the effective current amplification factor of the unit transistor Q32'—is changed very little. That is, $\Delta \beta 32'/\Delta \beta 32$ is quite small. This means that the effective current amplification factor $\beta 32'$ of unit transistor Q32' is practically constant.

Figure 4:
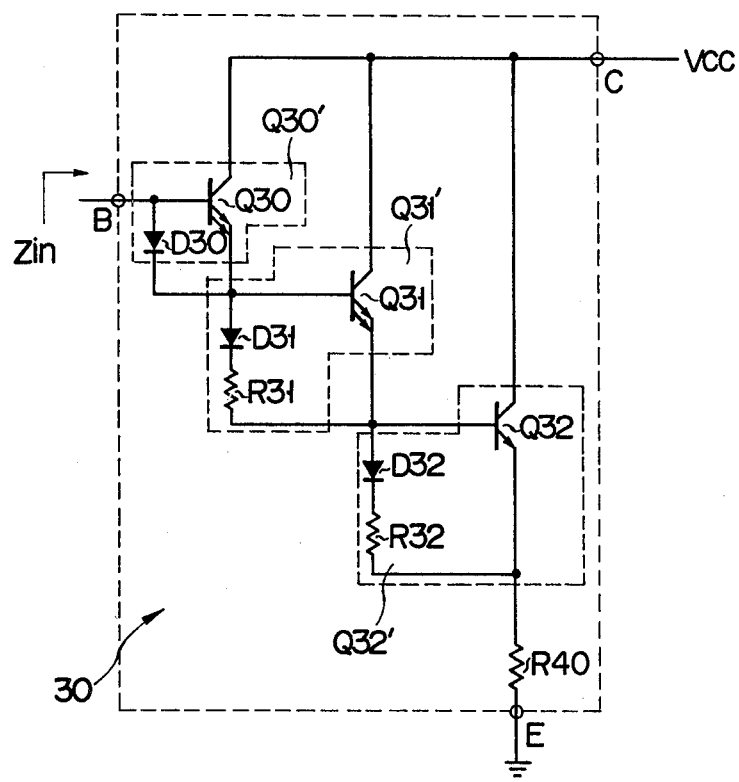
FIG. 4 shows a Darlington-connected unit transistor according to the present invention.

Equation (8) also suggests that $\beta 32'$ smaller than $\beta 32$. This disadvantage inherent to the unit transistor Q32' can be removed by the Darlington connection of plural unit transistors. FIG. 4 shows one example of Darlington connections of three unit transistors Q30'–Q32'.

In FIG. 4, the collector of an NPN double-emitter transistor Q30 is connected to a power supply VCC. The base and emitter of transistor Q30 are coupled via the anode-cathode path of a diode D30. The emitter of transistor Q30 is connected to the base of an NPN double-emitter transistor Q31. The base and emitter of transistor Q31 are coupled via the anode-cathode path of a diode D31 and a resistor R31. The collector of transistor Q31 is connected to power supply VCC and the emitter thereof is connected to the base of an NPN transistor Q32. The base and emitter of transistor Q32 are coupled via the anode-cathode path of a diode D32 and a resistor R32. The collector of transistor Q32 is connected to power supply VCC and the emitter thereof is grounded through a load resistor R40. The transistor circuit 30 shown in FIG. 4 has a high and constant input impedance Zin by means of the effective combination of the three current mirror circuits (unit transistors Q30'–Q32') with the Darlington connection.

Now, consideration will be given to the determination of the number of unit transistors which should be Darlington-connected. Let N denote the number of Darlington-connected unit transistors, $\beta 1$, $\beta 2$, $\beta 3$, ... , $\beta N$ denote the respective current amplification factors of unit transistors, and $\beta 0$ denote the desired current amplification factor. Then, the following should be satisfied:

$$\beta 0 = \beta 1 \cdot \beta 2 \cdot \beta 3 \ldots \quad (9)$$

For example, when $\beta 1 = \beta 2 = \beta 3 = 10$ and $\beta 0$ is required to be 1,000, then three-stage Darlington circuit (N=3) as shown in FIG. 4 is used.

Incidentally, equation (8) may be simplified if the value of $\beta 32$ is much larger than "1". That is:

$$\beta 32' \simeq n \cdot \exp \{(q/kT) \cdot R32 \cdot I2\} \quad (10)$$

Equation (10) teaches that a large n permits a reduction in R32 when the desired value of $\beta 32'$ is fixed. Accordingly, the transistor circuit of the present invention is well suited for IC fabrication. In IC fabrication, since n is determined by the ratio A2/A1 of the diffusion areas A1 and A2 as seen from FIG. 5, it is easy to make n large. However, it is difficult to make a high and accurate resistance (R32) in an IC.

In FIG. 2, a unit transistor Q30' including transistor Q30 and diode D30 has the resistance R30=0. Accordingly, the current amplification factor $\beta 30'$ of unit transistor Q30' is $\beta 30' = n$, as evident from equation (10). Further, if n=2, the current amplification factors of unit transistors Q31' and Q32' are $\beta 31' = 2\exp\{(q/kT) \cdot R31 \cdot I2\}$ and $\beta 32' = 2\exp\{(q/kT) \cdot R32 \cdot I2\}$, respectively. Since the circuit 30 of FIG. 2 has a constant input impedance, the discharge time constant for capacitor C20 remains unchanged. Therefore, an erroneous or inaccurate circuit operation due to input impedance changes is avoided.

FIG. 6 shows another equivalent circuit of the unit transistor. A diode-connected transistor D32A is used for the PN junction diode of FIG. 3 and a transistor Q32 has the emitter connected to a resistor R33. The resistor R33 may be used for adjusting the effective current amplification factor of the unit transistor (Q32, D32A, R32 and R33). The resistances of resistors R32 and R33 may of course be zero.

FIG. 7 shows still another equivalent circuit of a unit transistor. Bipolar transistors Q32A and Q32B are Darlington-connected for increasing the current amplification factor of transistor Q32B. In this case, a diode D32 may have two series-connected PN junctions.

Figure 8:
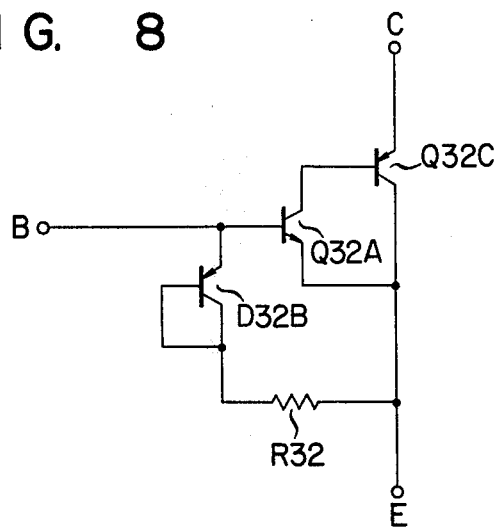
FIG. 8 shows another embodiment of the unit transistors of the present invention.

FIG. 8 shows another equivalent circuit of a unit transistor. Bipolar transistors Q32A and Q32C are inverted Darlington-connected, and a diode-connected transistor D32B is used.

Figure 9:
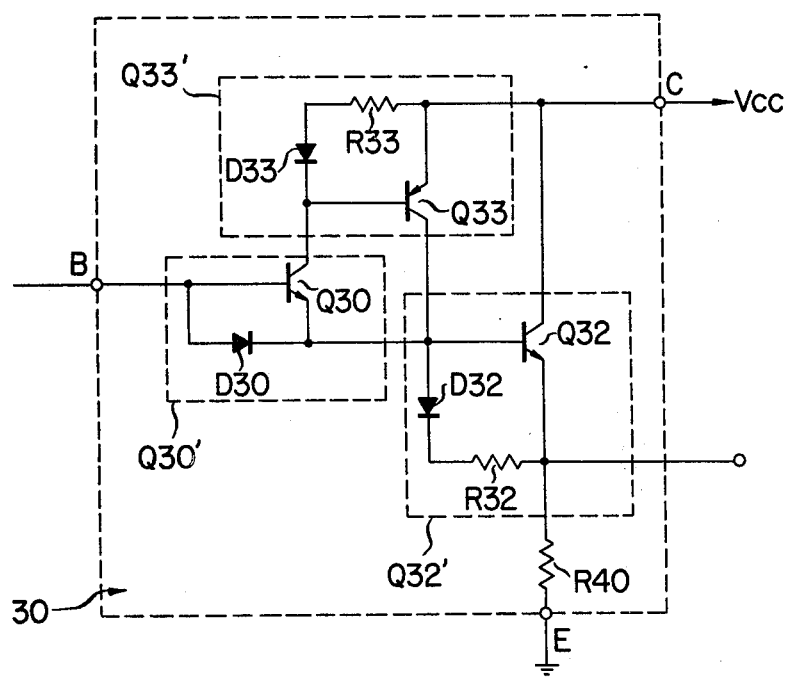
FIG. 9 shows the Darlington/inverted Darlington-connected unit transistors according to the present invention.

FIG. 9 shows a combination circuit of Darlington/inverted Darlington-connected unit transistors. The circuit may be used for the transistor circuit 30 of FIG. 2. In FIG. 9, a unit transistor Q30' (NPN) and a unit transistor Q33' (PNP) form an inverted Darlington circuit, and a unit transistor Q32' (NPN) as well as the transistors Q30' and Q33' form a Darlington circuit.

As apparent from the above, since the transistor circuit of the invention comprises Darlington-connected unit transistors each including a bipolar transistor and a diode coupled between the base-emitter of the transistor as shown in FIG. 4, it is free from the influence of the current amplification factor variation of a bipolar transistor.

It is noted that the present invention may be applied not only to a sample/hold circuit or an AM circuit but also to any other proper circuit.

What is claimed is:

1. A transistor circuit comprising:
   a signal input;
   a first current mirror circuit including a first transistor having a base coupled to said signal input, a collector coupled to a power source and an emitter, a first PN junction having a first terminal coupled to the base of said first transistor, the conductivity type of the first terminal of the first PN junction being the same as that of the transistor base, and a first resistor having a resistance greater than zero (short circuit) and less than infinity (open circuit) coupling a second terminal of said first diode to said emitter of said first transistor;
   a second current mirror circuit including a second transistor having a base coupled to said emitter of said first transistor so as to be in Darlington circuit configuration therewith, a collector coupled to a power source and an emitter, a second PN junction having a first terminal coupled to the base of said second transistor, the conductivity type of the first terminal of the second PN junction being the same as that of the second transistor base, and a second resistor having a resistance greater than zero (short circuit) and less than infinity (open circuit) coupling a second terminal of said second PN junction to said emitter of said second transistor; and
   a signal output coupled to said emitter of said second transistor.

2. A transistor circuit according to claim 1 wherein said first transistor and first PN junction are integrated on a common substrate and wherein an emitter semiconductor region of said first transistor is larger than a junction area of said first PN junction.

3. A transistor circuit according to claim 1 or 2 wherein said second transistor and second PN junction are integrated on a common substrate and wherein an emitter semiconductor region of said second transistor is larger than a junction area of said second PN junction.

4. A transistor circuit, according to claim 1 or 2, further comprising:
   a third transistor having a base coupled to the emitter of said second transistor, a collector coupled to a power supply and an emitter coupled through a third PN junction to the base of said third transistor, the conductivity type of the third PN junction coupled to the base of said third transistor being the same as that of the base thereof; and
   a load circuit coupled between the emitter of said third transistor and the other potential of said power supply,
   whereby an output signal of the transistor circuit is derived from the emitter of said third transistor.

5. A transistor circuit of claim 4 wherein said third transistor and third PN junction are integrated in the same semiconductor substrate in a manner that the emitter area of said third transistor is larger than the junction area of said third PN junction.

6. A transistor circuit of claim 4 further comprising resistor means coupled in series with said third PN junction for determining the effective current amplification factor of said third transistor.

7. A transistor circuit comprising:
   a power supply;

a signal input;

a first current mirror circuit including a first transistor having a base coupled to said signal input, a collector coupled to a power source and an emitter;

a second current mirror circuit including a second transistor having a base coupled to said emitter of said first transistor so as to be in Darlington circuit configuration therewith, a collector coupled to a power source and an emitter;

a third transistor having a base coupled to the emitter of said second transistor, a collector coupled to one potential of said power source and an emitter;

a first PN junction coupling said third transistor emitter to said third transistor base, the conductivity type of the portion of said first PN junction coupled to said third transistor base being the same as that of said third transistor base;

a fourth transistor having a base coupled to the emitter of said third transistor, a collector coupled to the one potential of said power supply, and an emitter coupled through a second PN junction to the base thereof, the conductivity type of the second PN junction coupled to the base of said fourth transistor being the same as that of the base thereof;

a fifth transistor having a base coupled to the emitter of said fourth transistor, a collector coupled to the one potential of said power supply, and an emitter coupled through a third PN junction to the base thereof, the conductivity type of the third PN junction coupled to the base of said fifth transistor being the same as that of the base thereof; and a load circuit coupled between the emitter of said fifth transistor and the other potential of said power supply, whereby an output signal of the transistor circuit is derived from the emitter of said fifth transistor.

8. A transistor circuit of claim 7 wherein said third transistor and first PN junction are formed in the same semiconductor substrate in a manner that the emitter area of said third transistor is larger than the junction area of said first PN junction.

9. A transistor circuit of claim 7 wherein said fourth transistor and second PN junction are formed in the same semiconductor substrate in a manner that the emitter area of said fourth transistor is larger than the junction area of said second PN junction.

10. A transistor circuit of claim 7 wherein said fifth transistor and third PN junction are formed in the same semiconductor substrate in a manner that the emitter area of said fifth transistor is larger than the junction area of said third PN junction.

11. A transistor circuit of claim 7 further comprising resistor means coupled in series with said first PN junction for determining the effective current amplification factor of said third transistor.

12. A transistor circuit of claim 7 further comprising resistor means coupled in series with said second PN junction for determining the effective current amplification factor of said fourth transistor.

13. A transistor circuit of claim 7 further comprising resistor means coupled in series with said third PN junction for determining the effective current amplification factor of said fifth transistor.

* * * * *